(12) United States Patent  (10) Patent No.: US 9,190,522 B2
Yamazaki  (45) Date of Patent: Nov. 17, 2015

(54) SEMICONDUCTOR DEVICE HAVING AN OXIDE SEMICONDUCTOR

(75) Inventor: Shunpei Yamazaki, Tokyo (JP)

(73) Assignee: Semiconductor Energy Laboratory Co., Ltd., Kanagawa (JP)

( * ) Notice: Subject to any disclaimer, the term of this patent is extended or adjusted under 35 U.S.C. 154(b) by 137 days.

(21) Appl. No.: 13/074,658

(22) Filed: Mar. 29, 2011

(65) Prior Publication Data

US 2011/0240994 A1  Oct. 6, 2011

(30) Foreign Application Priority Data

Apr. 2, 2010 (JP) ................................ 2010-086461

(51) Int. Cl.
*H01L 29/786* (2006.01)

(52) U.S. Cl.
CPC ...... *H01L 29/7869* (2013.01); *H01L 29/78606* (2013.01)

(58) Field of Classification Search
CPC ...................... H01L 29/7869; H01L 29/78606
USPC ...................................... 257/43, 410, E29.273
See application file for complete search history.

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |

(Continued)

FOREIGN PATENT DOCUMENTS

| | | |
|---|---|---|
| CN | 1405898 A | 3/2003 |
| CN | 101621076 A | 1/2010 |

(Continued)

OTHER PUBLICATIONS

Masaya Nakayama et al.; "17a-TL-8 Effect of GaO Layer on IGZO-TFT Channel"; Extended Abstracts (The 57th Spring Meeting 2010), The Japan Society of Applied Physics and Related Societies; Mar. 17, 2010; p. 21-008, with full English translation.
International Search Report (PCT Application No. PCT/JP2011/056493) dated Jun. 14, 2011.
Written Opinion (PCT Application No. PCT/JP2011/056493) dated Jun. 14, 2011.
International Search Report (PCT Application No. PCT/JP2011/056488) dated Jun. 28, 2011.
Written Opinion (PCT Application No. PCT/JP2011/056488) dated Jun. 28, 2011.

(Continued)

*Primary Examiner* — Kevin Parendo
(74) *Attorney, Agent, or Firm* — Fish & Richardson P.C.

(57) ABSTRACT

An object is to provide a semiconductor device including an oxide semiconductor, which has stable electric characteristics and high reliability. A semiconductor device includes an oxide semiconductor film, a source electrode and a drain electrode which are electrically connected to the oxide semiconductor film, a metal oxide film which is partly in contact with the oxide semiconductor film, a gate insulating film which is over and in contact with the metal oxide film, and a gate electrode over the gate insulating film. With such a structure, effect of charge on the oxide semiconductor film can be relaxed; thus, shift of the threshold voltage in the transistor, due to charge trapping at an interface of the oxide semiconductor film, can be suppressed.

19 Claims, 10 Drawing Sheets

(56) References Cited

U.S. PATENT DOCUMENTS

| | | |
|---|---|---|
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,727,824 B2 | 6/2010 | Yang et al. |
| 7,732,819 B2 | 6/2010 | Akimoto et al. |
| 7,791,072 B2 | 9/2010 | Kumomi et al. |
| 7,906,780 B2 | 3/2011 | Iwasaki |
| 7,927,931 B2 | 4/2011 | Yang et al. |
| 7,994,500 B2 | 8/2011 | Kim et al. |
| 8,058,645 B2 | 11/2011 | Jeong et al. |
| 8,129,719 B2 | 3/2012 | Yamazaki et al. |
| 8,148,779 B2 | 4/2012 | Jeong et al. |
| 8,158,974 B2 | 4/2012 | Yano et al. |
| 8,188,480 B2 | 5/2012 | Itai |
| 8,202,365 B2 | 6/2012 | Umeda et al. |
| 8,203,143 B2 | 6/2012 | Imai |
| 8,247,276 B2 | 8/2012 | Kondo et al. |
| 8,274,078 B2 | 9/2012 | Itagaki et al. |
| 8,502,221 B2 | 8/2013 | Yamazaki |
| 8,779,419 B2 | 7/2014 | Yano et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0047785 A1 | 3/2003 | Kawasaki et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0051793 A1* | 3/2005 | Ishida et al. ............... 257/119 |
| 2005/0136637 A1* | 6/2005 | Li et al. ............... 438/608 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0044714 A1 | 3/2007 | White |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0209576 A1* | 9/2007 | Sunkara et al. ............... 117/87 |
| 2007/0252928 A1 | 11/2007 | Ito et al. |
| 2007/0272922 A1* | 11/2007 | Kim et al. ............... 257/43 |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0210934 A1 | 9/2008 | Koinuma |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308806 A1* | 12/2008 | Akimoto et al. ............... 257/59 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0127552 A1 | 5/2009 | Li |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0186437 A1* | 7/2009 | Akimoto ............... 438/30 |
| 2009/0206301 A1 | 8/2009 | Marks |
| 2009/0236655 A1* | 9/2009 | Choi et al. ............... 257/325 |
| 2009/0278120 A1* | 11/2009 | Lee et al. ............... 257/43 |
| 2009/0278122 A1 | 11/2009 | Hosono et al. |
| 2009/0280600 A1 | 11/2009 | Hosono et al. |
| 2009/0321731 A1* | 12/2009 | Jeong et al. ............... 257/43 |
| 2009/0321732 A1 | 12/2009 | Kim et al. |
| 2010/0006833 A1 | 1/2010 | Ha et al. |
| 2010/0032668 A1 | 2/2010 | Yamazaki et al. |
| 2010/0038641 A1 | 2/2010 | Imai |
| 2010/0044711 A1 | 2/2010 | Imai |
| 2010/0051937 A1 | 3/2010 | Kaji et al. |
| 2010/0059746 A1 | 3/2010 | Itai |
| 2010/0065837 A1 | 3/2010 | Omura et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0163863 A1 | 7/2010 | Yaegashi |
| 2010/0200843 A1 | 8/2010 | Arai et al. |
| 2010/0244022 A1 | 9/2010 | Takahashi et al. |
| 2010/0264412 A1 | 10/2010 | Yamazaki et al. |
| 2010/0295041 A1 | 11/2010 | Kumomi et al. |
| 2010/0320458 A1 | 12/2010 | Umeda et al. |
| 2010/0320459 A1 | 12/2010 | Umeda et al. |
| 2011/0065216 A1 | 3/2011 | Kaji et al. |
| 2011/0095195 A1* | 4/2011 | Imai ............... 250/370.08 |
| 2011/0193083 A1 | 8/2011 | Kim et al. |
| 2011/0240990 A1 | 10/2011 | Yamazaki |
| 2011/0240991 A1 | 10/2011 | Yamazaki |
| 2011/0240992 A1 | 10/2011 | Yamazaki |
| 2011/0240993 A1 | 10/2011 | Yamazaki |
| 2011/0240995 A1 | 10/2011 | Yamazaki |
| 2011/0248260 A1 | 10/2011 | Yamazaki |
| 2012/0119205 A1 | 5/2012 | Taniguchi et al. |
| 2012/0286278 A1 | 11/2012 | Kondo et al. |

FOREIGN PATENT DOCUMENTS

| | | |
|---|---|---|
| EP | 1 737 044 A1 | 12/2006 |
| EP | 2141743 A1 | 1/2010 |
| EP | 2141744 A1 | 1/2010 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |

(56) References Cited

FOREIGN PATENT DOCUMENTS

| JP | 08-264794 A | 10/1996 |
|---|---|---|
| JP | 11-505377 A | 5/1999 |
| JP | 2000-031493 A | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-273361 A | 9/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-073701 A | 3/2007 |
| JP | 2007-201366 A | 8/2007 |
| JP | 2007-298947 A | 11/2007 |
| JP | 2009-094535 A | 4/2009 |
| JP | 2009-231613 A | 10/2009 |
| JP | 2009-277701 A | 11/2009 |
| JP | 2010-016347 A | 1/2010 |
| JP | 2010-016348 A | 1/2010 |
| JP | 4415062 B1 | 2/2010 |
| JP | 2010-062276 A | 3/2010 |
| JP | 2010-067954 A | 3/2010 |
| JP | 4571221 B1 | 10/2010 |
| KR | 2003-0022692 A | 3/2003 |
| KR | 2010-0002503 A | 1/2010 |
| WO | 2004/114391 A1 | 12/2004 |
| WO | WO-2007/086291 | 8/2007 |
| WO | 2008/105250 A1 | 9/2008 |
| WO | WO-2008/117739 | 10/2008 |
| WO | 2008/133345 A1 | 11/2008 |
| WO | 2009/139428 A1 | 11/2009 |

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates, D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A) May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp, 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission Amoled Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

(56) References Cited

OTHER PUBLICATIONS

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13th International Display Workshops, Dec. 7, 2006, pp. 663-666.
Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.
Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Meiboom, S et al., "Theory of The Blue Phase of Cholesteric Liquid Crystals," Phys. Rev. Lett. (Physical Review Letters), May 4, 1981, vol. 46, No. 18, pp. 1216-1219.
Miyasaka, M, "SUFTLA Flexible Microelectronics on Their Way to Business," SID Digest '07 : SID International Symposium Digest of Technical Papers, 2007, vol. 38, pp. 1673-1676.
Mo, Y et al., "Amorphous Oxide TFT Backplanes for Large Size AMOLED Displays," IDW '08 : Proceedings of the 6th International Display Workshops, Dec. 3, 2008, pp. 581-584.
Nakamura, "Synthesis of Homologous Compound with New Long-Period Structure," NIRIM Newsletter, Mar. 1995, vol. 150, pp. 1-4 with English translation.
Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.
Nomura, K et al., "Thin-Film Transistor Fabricated in Single-Crystalline Transparent Oxide Semiconductor," Science, May 23, 2003, vol. 300, No. 5623, pp. 1269-1272.
Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.
Nomura, K et al., "Room-Temperature Fabrication of Transparent Flexible Thin-Film Transistors Using Amorphous Oxide Semiconductors," Nature, Nov. 25, 2004, vol. 432, pp. 488-492.
Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.
Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.
Oba, F et al., "Defect energetics in ZnO: A hybrid Hartree-Fock density functional study," Phys. Rev. B (Physical Review. B), 2008, vol. 77, pp. 245202-1-245202-6.
Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.
Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.
Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
Orita, M et al., "Amorphous transparent conductive oxide InGaO3(ZnO)m (m<4):a Zn4s conductor," Philosophical Magazine, 2001, vol. 81, No. 5, pp. 501-515.
Orita, M et al., "Mechanism of Electrical Conductivity of Transparent InGaZnO4," Phys. Rev. B (Physical Review. B), Jan. 15, 2000, vol. 61, No. 3, pp. 1811-1816.
Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.
Osada, T et al., "Development of Driver-Integrated Panel Using Amorphous In—Ga—Zn—Oxide TFT," AM-FPD '09 Digest of Technical Papers, Jul. 1, 2009, pp. 33-36.
Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.
Park, J et al., "High performance amorphous oxide thin film transistors with self-aligned top-gate structure," IEDM 09: Technical Digest of International Electron Devices Meeting, Dec. 7, 2009, pp. 191-194.
Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.
Park, J et al., "Amorphous Indium—Gallium—Zinc Oxide TFTs and Their Application for Large Size AMOLED." AM-FPD '08 Digest of Technical Papers, Jul. 2, 2008, pp. 275-278.
Park, S et al., "Challenge to Future Displays: Transparent AM-OLED Driven by Peald Grown ZnO TFT," IMID '07 Digest, 2007, pp. 1249-1252.
Prins, M et al., "A Ferroelectric Transparent Thin-Film Transistor," Appl. Phys. Lett. (Applied Physics Letters), Jun. 17, 1996, vol. 68, No. 25, pp. 3650-3652.
Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.
Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.
Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.
Tsuda, K et al., "Ultra Low Power Consumption Technologies for Mobile TFT-LCDs," IDW '02 : Proceedings of the 9th International Display Workshops, Dec. 4, 2002, pp. 295-298.
Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.
Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

SEMICONDUCTOR DEVICE HAVING AN OXIDE SEMICONDUCTOR

BACKGROUND OF THE INVENTION

1. Field of the Invention

The present invention relates to a semiconductor device and a method for manufacturing the semiconductor device.

In this specification, a semiconductor device generally means a device which can function by utilizing semiconductor characteristics, and an electrooptic device, a semiconductor circuit, and an electronic device are all semiconductor devices.

2. Description of the Related Art

A technique by which transistors are formed using semiconductor thin films over a substrate having an insulating surface has been attracting attention. The transistor is applied to a wide range of electronic devices such as an integrated circuit (IC) or an image display device (display device). A silicon-based semiconductor material is widely known as a material for a semiconductor thin film applicable to a transistor. Besides, an oxide semiconductor has been attracted attention.

For example, a transistor whose active layer includes an amorphous oxide containing indium (In), gallium (Ga), and zinc (Zn) and having an electron carrier concentration of lower than $10^{18}/cm^3$ is disclosed (see Patent Document 1)

A transistor including an oxide semiconductor is known to have a problem of low reliability because of high possibility of change in electric characteristics, although the transistor including an oxide semiconductor can be operated at higher speed than a transistor including amorphous silicon and can be manufactured more easily than a transistor including polycrystalline silicon. For example, there are shifts of the threshold voltage in the transistor before and after a BT test performed under light. On the other hand, Patent Documents 2 and 3 each disclose a technique of preventing charge trapping at the interface of an oxide semiconductor layer by providing an interfacial stability layer which is in contact with a channel formation region of the oxide semiconductor layer, in order to suppress the shift of the threshold voltage in the transistor including an oxide semiconductor.

REFERENCE

[Patent Document 1] Japanese Published Patent Application No. 2006-165528
[Patent Document 2] Japanese Published Patent Application No. 2010-016347
[Patent Document 3] Japanese Published Patent Application No. 2010-016348

SUMMARY OF THE INVENTION

However, the transistor disclosed in Patent Document 2 or 3 has difficulty in suppressing charge trapping at the interface between an active layer and the interfacial stability layer because the interfacial stability layer is formed using a layer having the same characteristics as a gate insulating layer and thus the state of the interface with the active layer cannot be kept favorable. In particular, in the case where the band gap of the interfacial stability layer is equivalent to that of the active layer, it is likely to accumulate charge easily.

Thus, the transistor including an oxide semiconductor has not achieved sufficient reliability.

In view of the above problem, an object is to provide a semiconductor device including an oxide semiconductor, which has stable electric characteristics and high reliability.

One embodiment of the disclosed invention is based on the following technical idea: an oxide semiconductor film used as an active layer is not directly in contact with a gate insulating film, and a metal oxide film is provided between and in contact with these films and contains a constituent similar to that of the oxide semiconductor film. In other words, one embodiment of the disclosed invention has a stacked structure of an oxide semiconductor film, a metal oxide film and a gate insulating film containing a different constituent from the oxide semiconductor film and the metal oxide film. Here, the term "containing a constituent similar to that of an oxide semiconductor film" means containing one or more of metal elements which are included in the oxide semiconductor film.

Such a stacked structure makes it possible to sufficiently suppress trapping of charge or the like, which is generated due to operation of a semiconductor device, or the like, at the interface between the gate insulating film and the oxide semiconductor film. This advantageous effect is brought by the following mechanism: the metal oxide film containing a material compatible with the oxide semiconductor film is provided in contact with the oxide semiconductor film, whereby suppressed is trapping of charge or the like, which is generated due to the operation of a semiconductor device or the like, at the interface between the oxide semiconductor film and the metal oxide film. Meanwhile, the gate insulating film containing a material with which a charge trapping center can be formed at the interface is provided in contact with the metal oxide film, whereby the charge can be trapped at the interface between the metal oxide film and the insulating film.

In other words, by simply providing the metal oxide film, it is difficult to suppress charge trapping at an interface with the oxide semiconductor film in the case where a large amount of charge is generated; however, when the gate insulating film is in contact with the metal oxide film, charge is trapped preferentially at an interface between the metal oxide film and the gate insulating film, so that charge trapping at an interface between the oxide semiconductor film and the metal oxide film can be suppressed. As described above, the effect according to one embodiment of the disclosed invention is caused by a structure in which a gate insulating film containing a constituent different from those of a metal oxide film and an oxide semiconductor film, the metal oxide film containing a constituent similar to that of the oxide semiconductor film, and the oxide semiconductor film are stacked. The effect according to one embodiment of the disclosed invention differs from an effect caused by a structure in which a metal oxide film having the same characteristics as a gate insulating film and an oxide semiconductor film are stacked.

Since trapping of charge at the interface of the oxide semiconductor film can be suppressed and a charge trapping center can be kept away from the oxide semiconductor film, a semiconductor device can achieve a reduction in operation malfunctions and an increase in reliability.

In the above mechanism, the metal oxide film desirably has an enough thickness. This is because charge trapped at the interface between the metal oxide film and the gate insulating film may have a great influence on the oxide semiconductor film when the metal oxide film is thin. For example, the metal oxide film is preferably thicker than the oxide semiconductor film.

Further, the metal oxide film having an insulating property is formed so as not to hinder connection between the oxide semiconductor film and source and drain electrodes, so that resistance can be prevented from increasing as compared to the case where a metal oxide film exists between an oxide semiconductor film and a source electrode or a drain electrode. Thus, it is possible to suppress deterioration of electric characteristics of the transistor.

Note that the electrical conductivity of an oxide semiconductor changes when deviation from stoichiometric composition due to excess or deficiency of oxygen or the like occurs, or hydrogen or moisture which serves an electron donor enters the oxide semiconductor during a thin film formation process. Such a phenomenon becomes a factor of variation in the electric characteristics of a transistor including the oxide semiconductor. Thus, an impurity such as hydrogen, moisture, a hydroxyl group, or a hydride (also referred to as a hydrogen compound) is intentionally removed from the oxide semiconductor, and oxygen which is a main component of an oxide semiconductor is supplied to compensate for oxygen which has been reduced through the step of removing an impurity, whereby the oxide semiconductor film is highly purified and becomes an electrically i-type (intrinsic) oxide semiconductor.

The i-type (intrinsic) oxide semiconductor is an i-type (intrinsic) oxide semiconductor or a substantially i-type (intrinsic) oxide semiconductor which is obtained in such a manner that hydrogen which is an n-type impurity is removed from an oxide semiconductor, and the oxide semiconductor is purified so that impurities that are not main components of the oxide semiconductor are contained as little as possible.

Note that in the processing an oxide semiconductor film into an i-type oxide semiconductor film, the metal oxide film containing a constituent similar to that of the oxide semiconductor film can also be made an i-type film at the same time. According to one embodiment of the disclosed invention, the metal oxide film provided in contact with the oxide semiconductor film is preferably an electrically i-type metal oxide film in which an impurity such as moisture or hydrogen is sufficiently reduced.

The electric characteristics of a transistor including a highly purified oxide semiconductor film, such as threshold voltage and off-state current, have almost no temperature dependence. Further, change in transistor characteristics due to light deterioration hardly occurs.

One embodiment of the disclosed invention is a semiconductor device including an oxide semiconductor film, a source electrode and a drain electrode which are electrically connected to the oxide semiconductor film, a metal oxide film which is partly in contact with the oxide semiconductor film, a gate insulating film which is over and in contact with the metal oxide film, and a gate electrode over the gate insulating film.

In the above structure, the metal oxide film may contain an oxide of one or more of metal elements included in the oxide semiconductor film. The energy gap of the metal oxide film may be larger than that of the oxide semiconductor film. The energy at the bottom of the conduction band of the metal oxide film may be higher energy than that at the bottom of the conduction band of the oxide semiconductor film.

In the above structure, the metal oxide film may contain gallium oxide. The gate insulating film may contain silicon oxide or hafnium oxide.

In the above structure, at least a part of a top surface of the oxide semiconductor film may be in contact with the source electrode and the drain electrode. Alternatively, in the above structure, at least a part of a top surface of the source electrode and a part of a top surface of the drain electrode may be in contact with the oxide semiconductor film. Further alternatively, in the above structure, at least a part of a top surface of the source electrode and a part of a top surface of the drain electrode may be in contact with the oxide semiconductor film, and a side edge portion of the oxide semiconductor film and a side edge portion of the metal oxide film may be aligned in the channel length direction.

In the above structure, a second insulating film which covers the gate insulating film and the gate electrode may be provided. Alternatively, a conductive film may be provided below the oxide semiconductor film.

In the above structure, the channel length L of the transistor, which is determined by the distance between the source electrode and the drain electrode can be greater than or equal to 10 nm and less than or equal to 10 μm, for example, 0.1 μm to 0.5 μm. Needless to say, the channel length L may be greater than or equal to 1 μm. The channel width may be greater than or equal to 10 nm.

According to one embodiment of the present invention, a transistor having stable electric characteristics can be provided.

Further, according to one embodiment of the present invention, a semiconductor device which includes a transistor having favorable electric characteristics and high reliability can be provided.

DETAILED DESCRIPTION OF THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Note that the ordinal numbers such as "first" and "second" in this specification are used for convenience and do not denote the order of steps or the stacking order of layers. In addition, the ordinal numbers in this specification do not denote particular names which specify the present invention.

Embodiment 1

In this embodiment, one embodiment of a semiconductor device and a method for manufacturing the semiconductor device will be described with reference to FIGS. 1A to 1C, FIG. 2, FIGS. 3A to 3F, FIGS. 4A to 4D, and FIGS. 5A to 5D.

<Example of Structure of Semiconductor Device>

Figure 1A:
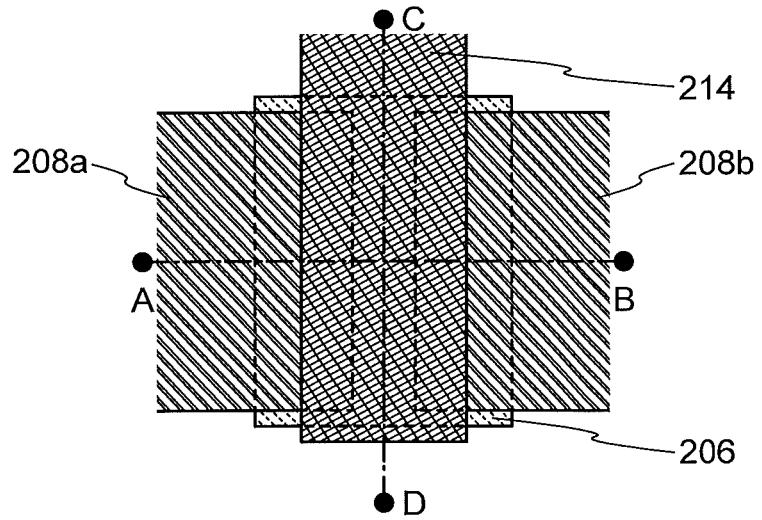
FIG. 1A is a plan view illustrating one embodiment of a semiconductor device and FIGS. 1B and 1C are cross-sectional views thereof.
Figure 1B:
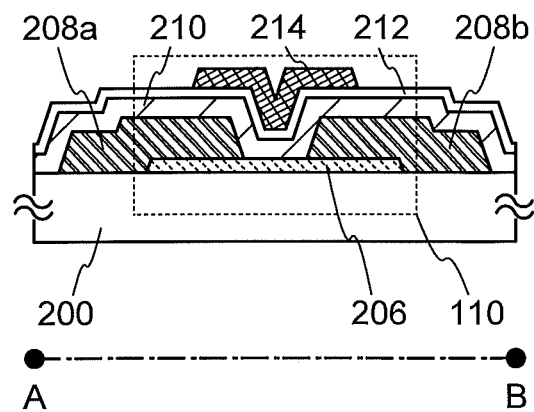
Figure 1C:
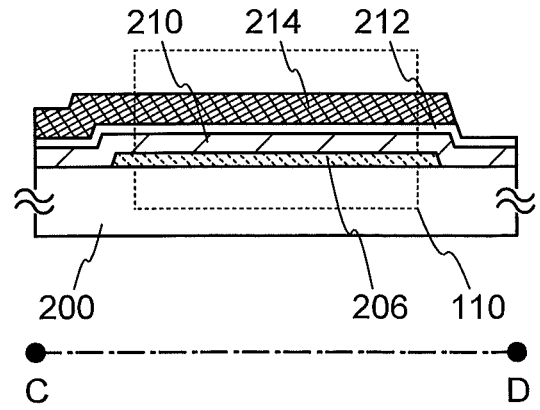

FIGS. 1A to 1C are a plan view and cross-sectional views, of a transistor 110 as an example of a semiconductor device according to one embodiment of the disclosed invention. Here, FIG. 1A is a plan view and FIGS. 1B and 1C are cross-sectional views taken along a line A-B and a line C-D, respectively, of FIG. 1A. In FIG. 1A, some of components of the transistor 110 are omitted to avoid complexity.

The transistor 110 illustrated in FIGS. 1A to 1C includes, over a substrate 200, an oxide semiconductor film 206, a source electrode 208a, a drain electrode 208b, a metal oxide film 210, a gate insulating film 212, and a gate electrode 214.

In the transistor illustrated in FIGS. 1A to 1C, the metal oxide film 210 is provided to cover the source electrode 208a and the drain electrode 208b.

Here, for the metal oxide film 210, an oxide of a constituent similar to that of the oxide semiconductor film 206 is preferably used. Specifically, the metal oxide film 210 is a film including an oxide of one or more of metal elements included in the oxide semiconductor film. Such a material is compatible with the oxide semiconductor film 206 and used for the metal oxide film 210, whereby an interface with the oxide semiconductor film can be kept favorable. That is, when the above material is used for the metal oxide film 210, charge trapping at an interface between an oxide semiconductor film and a metal oxide film which is in contact with the oxide semiconductor film (here, an interface between the oxide semiconductor film 206 and the metal oxide film 210) can be prevented.

Note that the metal oxide film 210 needs to have a larger energy gap than the oxide semiconductor film 206 because the oxide semiconductor film 206 functions as an active layer. In addition, between the metal oxide film 210 and the oxide semiconductor film 206, it is necessary to form an energy barrier with at least a level in which a carrier does not flow out from the oxide semiconductor film 206 at room temperature (20° C.). For example, the preferable energy difference between the bottom of the conduction band of the metal oxide film 210 and the bottom of the conduction band of the oxide semiconductor film 206 or between the top of the valence band of the metal oxide film 210 and the top of the valence band of the oxide semiconductor film 206 is 0.5 eV or more, further preferably 0.7 eV or more. In addition, the energy difference is 1.5 eV or less which is preferable.

Specifically, for example, in the case where an In—Ga—Zn—O-based material is used for the oxide semiconductor film 206, the metal oxide film 210 may be formed using a material containing gallium oxide, or the like. In the case where the gallium oxide is in contact with the In—Ga—Zn—O-based material, the energy barrier on the conduction band side is about 0.8 eV and the energy barrier on the valence band side is about 0.9 eV.

Note that gallium oxide is also referred to as $GaO_x$ and the value of x is preferably set so that the oxygen amount exceeds the stoichiometric proportion. For example, the preferable value of x is larger than or equal to 1.4 and smaller than or equal to 2.0, and the further preferable value is larger than or equal to 1.5 and smaller than or equal to 1.8. Note that a gallium oxide film may be doped with an impurity element other than hydrogen, e.g., an element belonging to Group 3 such as yttrium, an element belonging to Group 4 such as hafnium, an element belonging to Group 13 such as aluminum, an element belonging to Group 14 such as silicon, or nitrogen, whereby the energy gap of the gallium oxide is increased to improve its insulating property. The energy gap of a gallium oxide film which does not contain an impurity is 4.9 eV; however, when the gallium oxide film is doped with any of the above impurities at about, for example, greater than 0 atomic % and less than or equal to 20 atomic %, the energy gap can be increased to about 6 eV.

Considering a decrease in a charge source and a charge trapping center, it is desirable to sufficiently reduce an impurity such as hydrogen or water in the metal oxide film. This idea is similar to the idea of reduction of impurities in an oxide semiconductor film.

Further, the gate insulating film 212 is preferably formed using a material which allows a charge trapping center to be formed at an interface with the metal oxide film 210 when the gate insulating film 212 is in contact with the metal oxide film 210. With use of such a material for the gate insulating film 212, charge is trapped at the interface between the gate insulating film 212 and the metal oxide film 210, whereby charge trapping at the interface between the metal oxide film 210 and the oxide semiconductor film 206 can be sufficiently suppressed.

Specifically, the gate insulating film 212 may be formed as a single layer or a stacked layer, using any of silicon oxide, silicon nitride, aluminum oxide, aluminum nitride, mixed material of any of them, and the like. For example, in the case where a material containing gallium oxide is used for the metal oxide film 210, silicon oxide, silicon nitride, or the like is preferably used for the gate insulating film 212. In addition, it is preferable that the energy gap of the gate insulating film 212 be larger than that of the metal oxide film 210 because the gate insulating film 212 is in contact with the metal oxide film 210.

Note that a material of the gate insulating film 212 is not necessarily limited to the above material as long as a charge trapping center can be formed at the interface between the gate insulating film 212 and the metal oxide film 210. Further, treatment by which a charge trapping center is formed at the interface between the gate insulating film 212 and the metal oxide film 210 may be performed. Examples of such treatment include plasma treatment and element addition treatment (such as ion implantation).

Over the transistor 110, an insulating film may be further formed. Furthermore, an opening may be formed in the metal oxide film 210, the gate insulating film 212, or the like so that the source electrode 208a or the drain electrode 208b is electrically connected to a wiring. A second gate electrode may be provided below the oxide semiconductor film 206. Note that the oxide semiconductor film 206 is preferably processed to have an island shape, but it is not necessarily processed to have an island shape.

Figure 2:
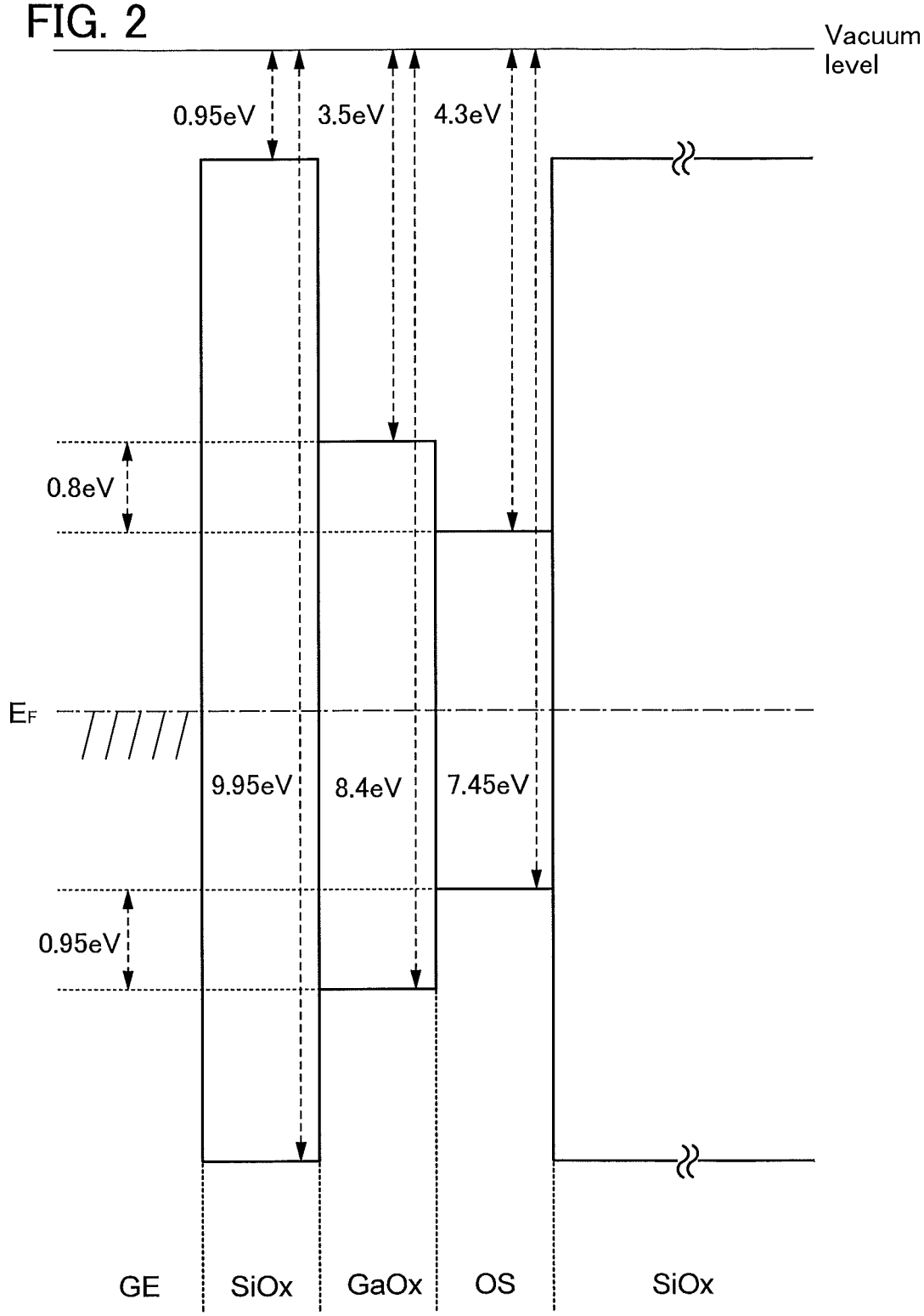
FIG. 2 is a band diagram of a transistor including an oxide semiconductor film and a metal oxide film.

FIG. 2 is an energy band diagram (schematic diagram) of the transistor 110, that is, an energy band diagram of the structure where the insulating film, the metal oxide film, the oxide semiconductor film, and the substrate are arranged from the gate electrode GE side. FIG. 2 shows the case where silicon oxide ($SiO_x$) (with a band gap Eg of 8 eV to 9 eV), gallium oxide ($GaO_x$) (with a band gap Eg of 4.9 eV), and an In—Ga—Zn—O-based non-single-crystal film (OS) (with a band gap Eg of 3.15 eV) are used as the insulating film, the metal oxide film, and the oxide semiconductor film, respectively, on the assumption of the ideal condition where the insulating film, the metal oxide film, and the oxide semiconductor film are all intrinsic films. In addition, the substrate is a glass substrate ($SiO_x$) containing silicon oxide as its main component. Note that the energy difference between the vacuum level and the bottom of the conduction band of the silicon oxide is 0.95 eV, the energy difference between the vacuum level and the bottom of the conduction band of the gallium oxide is 3.5 eV, and the energy difference between the vacuum level and the bottom of the conduction band of the In—Ga—Zn—O-based non-single-crystal film is 4.3 eV. Note that the Fermi level $E_F$ of the oxide semiconductor film is also shown in FIG. 2.

As shown in FIG. 2, on the gate electrode side (channel side) of the oxide semiconductor film, an energy barrier of about 0.8 eV and an energy barrier of about 0.95 eV exist at an interface between the oxide semiconductor and the metal oxide. Such energy barriers at the interface between the oxide semiconductor and the metal oxide prevent carrier transport at the interface; thus, the carriers do not transfer from the oxide semiconductor to the metal oxide but travel through the oxide semiconductor. That is, the oxide semiconductor film and materials (here, the metal oxide film and the insulating film) whose band gaps are wider than that of the oxide semiconductor are stacked so that the band gap in the stacked structure gradually increases, whereby the carriers travel inside the oxide semiconductor film.

FIGS. 3A to 3F illustrate cross-sectional structures of transistors which are different from the transistor 110. In FIGS. 3A to 3F, top-gate transistors are illustrated as transistors according to one embodiment of the disclosed invention.

Figure 3A:
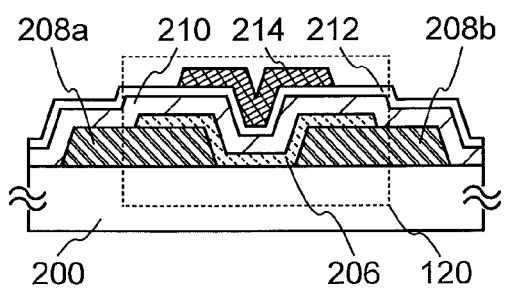
FIGS. 3A to 3F each illustrate one embodiment of a semiconductor device.

A transistor 120 illustrated in FIG. 3A includes the oxide semiconductor film 206, the source electrode 208a, the drain electrode 208b, the metal oxide film 210, the gate insulating film 212, and the gate electrode 214, which is similar to the transistor 110. A difference between the transistor 120 and the transistor 110 is in a position where the oxide semiconductor film 206 is connected to the source electrode 208a and/or the drain electrode 208b. In the transistor 120, a lower part of the oxide semiconductor film 206 is in contact with the source electrode 208a and/or the drain electrode 208b. The other components are similar to those of the transistor 110 in FIGS. 1A to 1C. For details, the description about FIGS. 1A to 1C can be referred to.

Figure 3B:
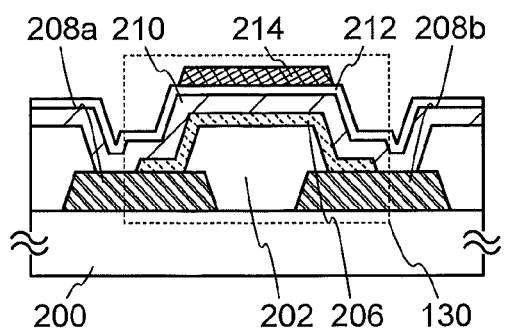

A transistor 130 illustrated in FIG. 3B includes the above components, which is similar to the transistor 120 in FIG. 3A. A difference between the transistor 130 and the transistor 120 is in whether an insulating film 202 having a projection is provided or not. In the transistor 130 illustrated in FIG. 3B, the insulating film 202 is provided over the source electrode 208a and the drain electrode 208b so that at least parts of top surfaces of the source electrode 208a and the drain electrode 208b are exposed, and over the insulating film, the oxide semiconductor film 206 is formed. Since the insulating film 202 between the source electrode 208a and the drain electrode 208b has a projected shape, the oxide semiconductor film 206 between the source electrode 208a and the drain electrode 208b also has a projected shape. The other components are similar to those of the transistor 120 in FIG. 3A.

Figure 3C:
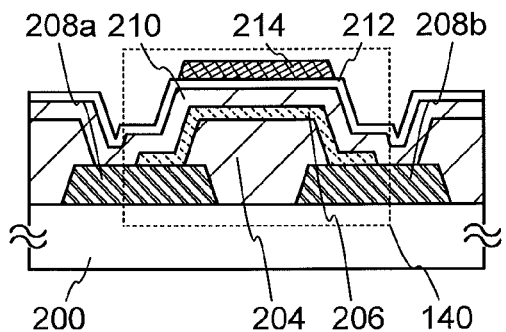

A transistor 140 illustrated in FIG. 3C includes the above components, which is similar to the transistor 130 in FIG. 3B. A difference between the transistor 140 and the transistor 130 is in that a metal oxide film 204 containing a constituent similar to that of the metal oxide film 210 is provided instead of the insulating film 202. The other components are similar to those of the transistor 130 in FIG. 3B.

Figure 3D:
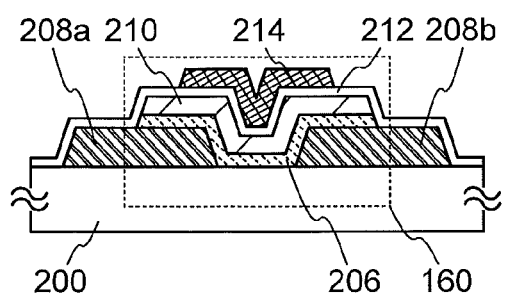
Figure 3E:
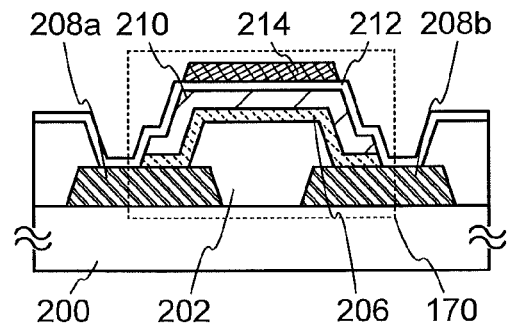
Figure 3F:
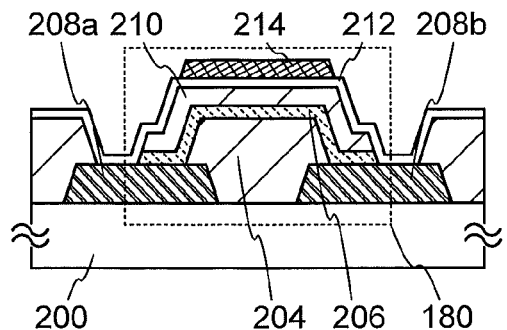

A transistor 160 illustrated in FIG. 3D, a transistor 170 illustrated in FIG. 3E, and a transistor 180 illustrated in FIG. 3F include the above components, which are similar to the transistor 120 in FIG. 3A, the transistor 130 in FIG. 3B, and the transistor 140 in FIG. 3C, respectively. A difference between the transistors 160, 170, and 180 and the transistor 120, 130, and 140 is in that whether the metal oxide film 210 is processed to have an island shape or not. Here, in the channel length direction, a side edge portion of the oxide semiconductor film 206 is substantially aligned with a side edge portion of the metal oxide film 210, which is preferable. The other components are similar to those of the transistors 120, 130, and 140 in FIGS. 3A to 3C.

Further, in each of the transistors illustrated in FIGS. 1A to 1C and FIGS. 3A to 3F, a base insulating film may be provided below the oxide semiconductor film 206, and a conductive film may be provided so as to overlap with the oxide semiconductor film 206 with the base insulating film interposed therebetween. This conductive film functions as a so-called back gate electrode.

<Example of Manufacturing Process of Transistor>

Hereinafter, examples of manufacturing processes of transistors illustrated in FIGS. 1A to 1C and FIG. 3A will be described with reference to FIGS. 4A to 4D and FIGS. 5A to 5D.

<Manufacturing Process of Transistor 110>

An example of a manufacturing process of the transistor 110 illustrated in FIGS. 1A to 1C will be described with reference to FIGS. 4A to 4D.

Figure 4A:
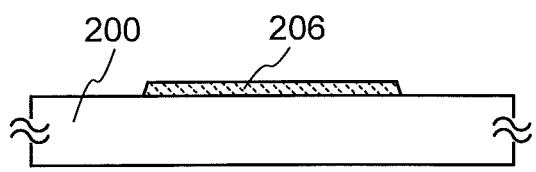
FIGS. 4A to 4D illustrate an example of a manufacturing process of a semiconductor device.

First, an oxide semiconductor film is formed over the substrate 200, and the oxide semiconductor film is processed into the island shaped oxide semiconductor film 206 (see FIG. 4A).

Although there is no particular limitation on a substance or the like of the substrate 200, it is necessary that the substrate have at least heat resistance to withstand heat treatment performed later. For example, a glass substrate, a ceramic substrate, a quartz substrate, a sapphire substrate, or the like can be used as the substrate 200. Further, a single crystal semiconductor substrate or a polycrystalline semiconductor substrate of silicon, carbon silicon, or the like; a compound semiconductor substrate of silicon germanium or the like; an SOI substrate; or the like can be used. Furthermore, the substrate 200 may be any of these substrates over which a semiconductor element is provided.

Further, a flexible substrate may be used as the substrate 200. In the case where a transistor is provided over a flexible substrate, the transistor may be manufactured directly over the flexible substrate. Alternatively, the transistor may be formed over a different substrate, separated from the substrate, and then transferred to the flexible substrate. Note that in order to separate the transistor to transfer it to the flexible substrate, a separation layer may be formed between the different substrate and the transistor.

It is preferable to form the oxide semiconductor film by a method by which hydrogen, water, or the like does not easily enter the oxide semiconductor film. For example, a sputtering method can be used. The preferred thickness of the oxide semiconductor film is greater than or equal to 3 nm and less than or equal to 30 nm. The oxide semiconductor film with a large thickness (e.g., greater than or equal to 50 nm) causes a normally-on transistor.

As a material used for the oxide semiconductor film, a four-component metal oxide material such as an In—Sn—Ga—Zn—O-based material; a three-component metal oxide material such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-component metal oxide material such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; or a single metal oxide such as an In—O-based material, a Sn—O-based material, or a Zn—O-based material can be used. In addition, the above materials may contain $SiO_2$. Here, for example, an In—Ga—Zn—O-based material means oxide containing indium (In), gallium (Ga), and zinc (Zn), and there is no particular limitation on the composition ratio. Further, the In—Ga—Zn—O-based oxide semiconductor film may contain an element other than In, Ga, and Zn.

For the oxide semiconductor film, a thin film using a material represented by the chemical formula, $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like.

In this embodiment, the oxide semiconductor film is formed by a sputtering method using an In—Ga—Zn—O-based oxide semiconductor target.

As a target in the case of using an In—Ga—Zn—O-based material for an oxide semiconductor, for example, a target for formation of an oxide semiconductor film with a composition ratio of $In_2O_3:Ga_2O_3:ZnO=1:1:1$ [molar ratio] can be used. Note that it is not necessary to limit a material and composition of the target to the above. For example, a target for formation of an oxide semiconductor film with a composition ratio of $In_2O_3:Ga_2O_3:ZnO=1:1:2$ [molar ratio] can be used.

In the case where an In—Zn—O-based material is used for the oxide semiconductor, a target used has a composition ratio of In:Zn=50:1 to 1:2 in an atomic ratio ($In_2O_3:ZnO=25:1$ to 1:4 in a molar ratio), preferably In:Zn=20:1 to 1:1 in an atomic ratio ($In_2O_3:ZnO=10:1$ to 1:2 in a molar ratio), further preferably In:Zn=15:1 to 1.5:1 ($In_2O_3:ZnO=15:2$ to 3:4 in a molar ratio). For example, a target used for the formation of an In—Zn—O-based oxide semiconductor has an atomic ratio of In:Zn:O=X:Y:Z, where the relation of Z>1.5X+Y is satisfied.

The fill rate of the target for formation of an oxide semiconductor film is greater than or equal to 90% and less than or equal to 100%, preferably, greater than or equal to 95% and less than or equal to 99.9%. With the use of the target for formation of an oxide semiconductor film with high fill rate, a dense oxide semiconductor film can be formed.

The atmosphere for film formation may be a rare gas (typically argon) atmosphere, an oxygen atmosphere, or a mixed atmosphere containing a rare gas and oxygen. Further, in order to prevent hydrogen, water, a hydroxyl group, a hydride, or the like to enter the oxide semiconductor film, an atmosphere of a high purity gas from which an impurity such as hydrogen, water, a hydroxyl group, or a hydride is sufficiently removed.

For example, the oxide semiconductor film can be formed as follows.

The substrate 200 is placed in the deposition chamber under reduced pressure, and the substrate temperature is set to higher than or equal to 100° C. and lower than or equal to 600° C., preferably higher than or equal to 200° C. and lower than or equal to 400° C. When film formation is performed in the condition where the substrate 200 is heated, the impurity concentration contained in the oxide semiconductor film can be low. In addition, damage due to sputtering can be reduced.

Then, a high purity gas from which impurities such as hydrogen and moisture are sufficiently removed is introduced while residual moisture in the deposition chamber is removed, and the oxide semiconductor film is formed over the substrate 200 using the above target. In order to remove residual moisture in the deposition chamber, an entrapment vacuum pump such as a cryopump, an ion pump, or a titanium sublimation pump is preferably used as an evacuation unit. An evacuation unit may be a turbo pump provided with a cold trap. In the deposition chamber in which evacuation is performed using a cryopump, a hydrogen molecule, a compound including a hydrogen atom such as water ($H_2O$), (preferably, a compound including a carbon atom), or the like is removed. Thus, the concentration of impurities included in the oxide semiconductor film formed in the deposition chamber can be reduced.

As an example of the deposition condition, the following conditions are employed: the distance between the substrate and the target is 100 mm, the pressure is 0.6 Pa, the direct-current (DC) power is 0.5 kW, and the deposition atmosphere is an oxygen atmosphere (the proportion of oxygen flow: 100%). Note that a pulse direct current power source is preferable because powder substances (also referred to as particles or dust) generated in deposition can be reduced and the film thickness can be uniform.

Note that before the oxide semiconductor film is formed by a sputtering method, powdery substances (also referred to as particles or dust) which are attached on a surface of the substrate 200 are preferably removed by reverse sputtering in which an argon gas is introduced and plasma is generated. The reverse sputtering refers to a method in which voltage is applied to the substrate and plasma is generated in the vicinity of the substrate to modify a surface of the substrate side. Note that instead of argon, a gas of nitrogen, helium, oxygen or the like may be used.

The oxide semiconductor film can be processed by etching after a mask having a desired shape is formed over the oxide semiconductor film. The above mask can be formed by a method such as photolithography. Alternatively, the mask may be formed by an inkjet method.

Note that either dry etching or wet etching may be performed for etching of the oxide semiconductor film. It is needless to say that these may be combined.

After that, heat treatment (first heat treatment) is performed on the oxide semiconductor film, which is preferable. Excessive hydrogen (including water and a hydroxyl group) in the oxide semiconductor film is removed by the first heat treatment and a structure of the oxide semiconductor film is improved, so that the defect level in an energy gap of the oxide semiconductor film can be reduced. The first heat treatment is performed at higher than or equal to 250° C. and lower than or equal to 650° C., preferably higher than or equal to 450° C. and lower than or equal to 600° C. or lower than the strain point of the substrate.

The heat treatment can be performed in such a way that, for example, an object to be heated is introduced into an electric furnace in which a resistance heating element or the like is used and heated, in a nitrogen atmosphere at 450° C. for an hour. The oxide semiconductor film is not exposed to air during the heat treatment so that entry of water or hydrogen can be prevented.

The heat treatment apparatus is not limited to the electric furnace and may be an apparatus for heating an object by thermal radiation or thermal conduction from a medium such as a heated gas. For example, an RTA (rapid thermal anneal) apparatus such as a GRTA (gas rapid thermal anneal) apparatus or an LRTA (lamp rapid thermal anneal) apparatus can be used. A GRTA apparatus is an apparatus for performing heat treatment using a high-temperature gas. As the gas, an inert gas which does not react with an object to be heated by heat treatment, such as nitrogen or a rare gas such as argon is used. An LRTA apparatus is an apparatus for heating an object to be heated by radiation of light (an electromagnetic wave) emitted from a lamp such as a halogen lamp, a metal halide lamp, a xenon arc lamp, a carbon arc lamp, a high pressure sodium lamp, or a high pressure mercury lamp.

For example, as the first heat treatment, a GRTA process may be performed as follows. The object is put in an inert gas atmosphere that has been heated, heated for several minutes, and taken out from the inert gas atmosphere. The GRTA process enables high-temperature heat treatment for a short time. Moreover, the GRTA process can be employed even when the temperature exceeds the upper temperature limit of the object. Note that the inert gas may be switched to a gas including oxygen during the process. This is because the defect level in energy gap due to oxygen deficiency can be reduced by performing the first heat treatment in an atmosphere containing oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6 N (99.9999%), preferably greater than or equal to 7 N (99.99999%) (that is, the concentration of the impurities is less than or equal to 1 ppm, preferably less than or equal to 0.1 ppm).

In any case, the impurity is reduced by the first heat treatment so that the i-type (intrinsic) or substantially i-type oxide semiconductor film is obtained. Accordingly, a transistor having significantly excellent characteristics can be realized.

The above heat treatment (first heat treatment) can be referred to as dehydration treatment, dehydrogenation treatment, or the like because of its effect of removing hydrogen, water, or the like. The dehydration treatment or dehydrogenation treatment can be performed at any timing, for example, after the oxide semiconductor film is processed to have an island shape. Such dehydration treatment or dehydrogenation treatment may be conducted once or more times.

Note that an example in which the first heat treatment is performed after the oxide semiconductor film is processed to have an island shape is described here; however, one embodiment of the disclosed invention is not interpreted as being limited thereto. After the first heat treatment is performed, the oxide semiconductor film may be processed.

Figure 4B:
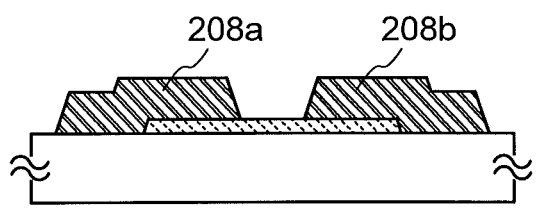
Figure 4C:
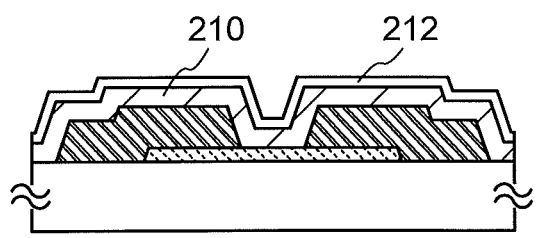

Next, a conductive film to be a source electrode and a drain electrode (including a wiring formed in the same layer as the source and drain electrodes) is formed over the oxide semiconductor film 206, and the conductive film is processed, so that the source electrode 208a and the drain electrode 208b are formed (see FIG. 4B). Note that the channel length L of a transistor is determined by the distance between an end portion of the source electrode 208a and an end portion of the drain electrode 208b.

As the conductive film used for the source electrode 208a and the drain electrode 208b, for example, a metal film including an element selected from Al, Cr, Cu, Ta, Ti, Mo, and W, or a metal nitride film including any of the above elements as its component (e.g., a titanium nitride film, a molybdenum nitride film, or a tungsten nitride film) can be used. In addition, the conductive film may have a such a stacked structure that a film of refractory metal such as Ti, Mo, or W or a metal nitride film thereof (e.g., a titanium nitride film, a molybdenum nitride film, or a tungsten nitride film) is formed over or/and below the metal film such as an Al film or a Cu film.

Alternatively, the conductive film to be the source electrode 208a and the drain electrode 208b may be formed using a conductive metal oxide. As conductive metal oxide, indium oxide ($In_2O_3$), tin oxide ($SnO_2$), zinc oxide (ZnO), indium oxide-tin oxide alloy ($In_2O_3$—$SnO_2$; abbreviated to ITO), indium oxide-zinc oxide alloy ($In_2O_3$—ZnO), or any of these metal oxide materials in which silicon oxide is contained can be used.

The conductive film may be processed by etching using a resist mask. Ultraviolet, a KrF laser light, an ArF laser, or the like is preferably used for light exposure for forming a photoresist mask for the etching.

In the case where the channel length L is less than 25 nm, the light exposure at the time of forming the resist mask is preferably performed using extreme ultraviolet light having an extremely short wavelength of several nanometers to several tens of nanometers, for example. In the light exposure by extreme ultraviolet light, the resolution is high and the focal depth is large. Thus, the channel length L of the transistor formed later can be decreased, and operation speed of a circuit can be increased.

Alternatively, the etching step may be performed with use of a resist mask which is formed using a so-called multi-tone mask. A resist mask formed using a multi-tone mask has a plurality of thicknesses and can be further changed in shape by ashing; thus, such a resist mask can be used in a plurality of etching steps for different patterns. Therefore, a resist mask corresponding to at least two kinds of different patterns can be formed by using one multi-tone mask. That is, the steps can be simplified.

Note that in etching of the conductive film, the semiconductor oxide film 206 is partly etched and thus, an oxide semiconductor film having a groove (a recessed portion) is formed in some cases.

After that, by plasma treatment using a gas such as $N_2O$, $N_2$, or Ar, water or the like on a surface of an exposed portion of the oxide semiconductor film may be removed. In the case of performing plasma treatment, the metal oxide film 210 which is partly in contact with the oxide semiconductor film 206 is preferably formed continuously without being exposed to air.

Next, the metal oxide film 210 is formed so as to cover the source electrode 208a and the drain electrode 208b and be partly in contact with the oxide semiconductor film 206. Then, the gate insulating film 212 is formed so as to be in contact with the metal oxide film 210 (see FIG. 4C).

For the metal oxide film 210, an oxide of a constituent similar to that of the oxide semiconductor film 206 is preferably used. Such a material is compatible with the oxide semiconductor film 206 and used for the metal oxide film 210, whereby an interface with the oxide semiconductor film can be kept favorable. That is, when the above material is used for the metal oxide film 210, charge trapping at an interface between an oxide semiconductor film and a metal oxide film which is in contact with the oxide semiconductor film (here, an interface between the oxide semiconductor film 206 and the metal oxide film 210) can be prevented.

Note that the metal oxide film 210 needs to have a larger energy gap than the oxide semiconductor film 206 because the oxide semiconductor film 206 functions as an active layer. In addition, between the metal oxide film 210 and the oxide semiconductor film 206, it is necessary to form an energy barrier with at least a level in which carriers do not flow out from the oxide semiconductor film 206 at room temperature (20° C.). For example, the preferable energy difference between the bottom of the conduction band of the metal oxide film 210 and the bottom of the conduction band of the oxide semiconductor film 206 or between the top of the valence band of the metal oxide film 210 and the top of the valence band of the oxide semiconductor film 206 is 0.5 eV or more, further preferably 0.7 eV or more. In addition, the energy difference is 1.5 eV or less, which is preferable.

Considering a decrease in a charge source and a charge trapping center, it is desirable to sufficiently reduce an impurity such as hydrogen or water in the metal oxide film. This idea is similar to the idea of reduction of impurities in an oxide semiconductor film.

Although there is no particular limitation on a formation method of the metal oxide film 210, it is preferable to use a method by which hydrogen, water, or the like does not easily enter the oxide semiconductor film 206 and the metal oxide film 210. For example, a sputtering method can be used.

The gate insulating film 212 is preferably formed using a material which allows a charge trapping center to be formed at an interface with the metal oxide film 210 when the gate insulating film 212 is in contact with the metal oxide film 210. With use of such a material for the gate insulating film 212, charge is trapped at the interface between the gate insulating film 212 and the metal oxide film 210, whereby charge trapping at the interface between the metal oxide film 210 and the oxide semiconductor film 206 can be sufficiently suppressed.

Specifically, the gate insulating film 212 may be formed using any of silicon oxide, silicon nitride, aluminum oxide, aluminum nitride, mixed material of any of them, and the like. For example, in the case where a material containing gallium oxide is used for the metal oxide film 210, silicon oxide, silicon nitride, or the like is preferably used for the gate insulating film 212. In addition, it is preferable that the energy gap of the gate insulating film 212 be larger than that of the metal oxide film 210 because the gate insulating film 212 is in contact with the metal oxide film 210.

Further, a material having a high relative dielectric constant such as hafnium oxide may be used for the gate insulating film 212 considering a function of a gate insulating film in a transistor. Even in such a case, it is preferable to use a material which allows a charge trapping center to be formed at an interface with the metal oxide film 210 when the gate insulating film 212 is in contact therewith.

Note that a material of the gate insulating film 212 is not necessarily limited to the above material as long as a charge trapping center can be formed at the interface between the gate insulating film 212 and the metal oxide film 210. Further, treatment by which a charge trapping center is formed at the interface between the gate insulating film 212 and the metal oxide film 210 may be performed. Examples of such treatment include plasma treatment and element addition treatment (such as ion implantation).

Although there is no particular limitation on a formation method of the gate insulating film 212, a deposition method such as a plasma CVD method or a sputtering method can be employed for forming the gate insulating film 212. The gate insulating film 212 may have a single-layer structure of an insulating film including any of the above materials or a stacked structure thereof.

After the metal oxide film 210 is formed or after the gate insulating film 212 is formed, it is preferable to perform second heat treatment. The second heat treatment is performed at a temperature higher than or equal to 250° C. and lower than or equal to 700° C., preferably higher than or equal to 450° C. and lower than or equal to 600° C. or lower than a strain point of the substrate.

The second heat treatment may be performed in an atmosphere of nitrogen, oxygen, ultra-dry air (air in which a water content is less than or equal to 20 ppm, preferably less than or equal to 1 ppm, further preferably, less than or equal to 10 ppb), or a rare gas (argon, helium, or the like). Note that it is preferable that water, hydrogen, or the like be not contained in the atmosphere of nitrogen, oxygen, ultra-dry air, or a rare gas. It is also preferable that the purity of nitrogen, oxygen, or the rare gas which is introduced into a heat treatment apparatus be set to greater than or equal to 6 N (99.9999%), preferably greater than or equal to 7 N (99.99999%) (that is, the impurity concentration is 1 ppm or less, preferably 0.1 ppm or less).

In the second heat treatment, the oxide semiconductor film 206 and the metal oxide film 210 are heated in a state where they are in contact with each other, whereby oxygen which is one of main components of the oxide semiconductor film can be supplied from the metal oxide film 210 to the oxide semiconductor film because oxygen may be reduced by the dehydration (or dehydrogenation) treatment. Accordingly, the charge trapping center in the oxide semiconductor film can be decreased.

Moreover, through this heat treatment, the impurity in the metal oxide film 210 can also be removed, resulting in high purification.

Note that there is no particular limitation on timing of the above second heat treatment as long as it is after formation of the oxide semiconductor film 206. For example, the second heat treatment may be performed after the gate electrode 214 is formed. Alternatively, the second heat treatment may be performed following the first heat treatment, the first heat treatment may double as the second heat treatment, or the second heat treatment may double as the first heat treatment.

As described above, at least one of the first heat treatment and the second heat treatment is applied, whereby the oxide semiconductor film 206 can be highly purified so as to minimize the amount of impurities that are not main components of the oxide semiconductor. In addition, a purified oxide semiconductor includes extremely few (close to zero) carriers derived from a donor, and the carrier concentration thereof is lower than $1 \times 10^{14}/cm^3$, preferably lower than $1 \times 10^{12}/cm^3$, further preferably lower than $1 \times 10^{11}/cm^3$.

Figure 4D:
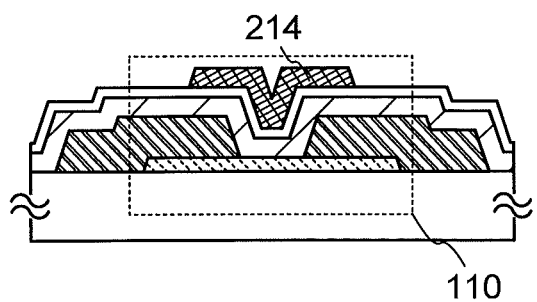

Then, the gate electrode 214 is formed (see FIG. 4D). The gate electrode 214 can be formed using a metal material such as molybdenum, titanium, tantalum, tungsten, aluminum, copper, neodymium, or scandium, or an alloy material which includes any of these materials as a main component. Note that the gate electrode 214 may have a single-layer structure or a stacked-layer structure.

Through the above process, the transistor 110 is formed.

<Manufacturing Process of Transistor 120>

An example of a manufacturing process of the transistor 120 illustrated in FIG. 3A will be described with reference to FIGS. 5A to 5D. Note that a manufacturing process of the transistor 160 illustrated in FIG. 3D is similar to that of the transistor 120 except that the metal oxide semiconductor film 210 is processed in accordance with a shape of the oxide semiconductor film 206.

Figure 5A:
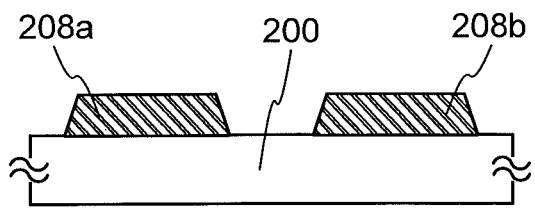
FIGS. 5A to 5D illustrate an example of a manufacturing process of a semiconductor device.
Figure 5B:
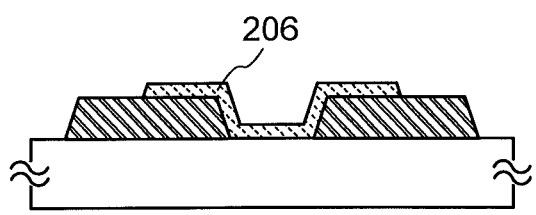
Figure 5C:
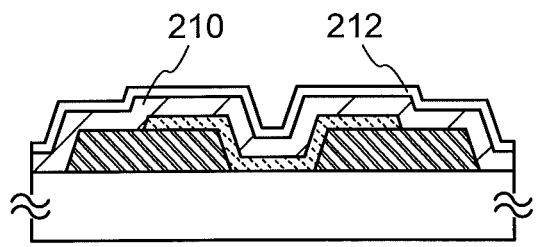

First, a conductive film to be a source electrode and a drain electrode (including a wiring formed in the same layer as the source and drain electrodes) is formed over the substrate 200, and the conductive film is processed, so that the source electrode 208a and the drain electrode 208b are formed (see FIG. 5A). For details, the description of the manufacturing process of the transistor 110 can be referred to.

Next, an oxide semiconductor film connected to the source electrode 208a and the drain electrode 208b is formed. Then, the oxide semiconductor film is processed to be the island-shaped oxide semiconductor film 206 (see FIG. 5B). For details, the description of the manufacturing process of the transistor 110 can be referred to.

Next, the metal oxide film 210 is formed so as to cover the source electrode 208a and the drain electrode 208b and be in contact with part of the oxide semiconductor film 206. Then, the gate insulating film 212 is formed so as to be in contact with the metal oxide film 210 (see FIG. 5C). For details, the description of the manufacturing process of the transistor 110 can be referred to.

Figure 5D:
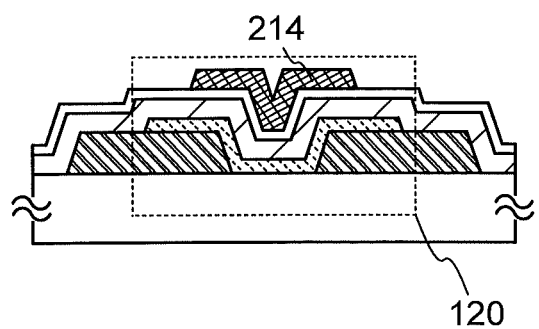

After that, the gate electrode 214 is formed (see FIG. 5D). For details, the description of the manufacturing process of the transistor 110 can be referred to.

Through the above process, the transistor 120 is formed.

In the transistor according to this embodiment, the metal oxide film containing a constituent similar to that of the oxide semiconductor film is provided between the oxide semiconductor film and the gate insulating film, and as the gate insulating film in contact with the metal oxide film, an insulating film containing a constituent different from that of the metal oxide film and that of the oxide semiconductor film is provided to be in contact with the metal oxide film. As described above, the metal oxide film containing a material compatible with the oxide semiconductor film is provided in contact with the oxide semiconductor film, which suppresses, at the interface between the oxide semiconductor film and the metal oxide film, trapping of charge or the like which can be generated due to the operation of a semiconductor device or the like. Meanwhile, an insulator (the gate insulating film) containing a material which allows a charge trapping center to be formed at the interface is provided so as to be in contact with the metal oxide film, whereby the charge can be trapped at the interface between the metal oxide film and the insulator. With such a structure, the oxide semiconductor film can be less adversely affected by charge, which suppresses shift of the threshold value of the transistor due to trapping of charge at the interface of the oxide semiconductor film.

The oxide semiconductor film used for the active layer of the transistor is a highly purified oxide and electrically i-type (intrinsic) semiconductor film obtained by heat treatment through which an impurity such as hydrogen, moisture, a hydroxyl group, or a hydride (also referred to as a hydrogen compound) is removed from the oxide semiconductor and oxygen which is a main component of the oxide semiconductor is supplied to compensate for oxygen which has been reduced concurrently with a step of removing impurities. The transistor including the oxide semiconductor film which is highly purified in such a manner has electric characteristics with less variation, and thus is electrically stable.

When charge is trapped at the interface of the oxide semiconductor film, the threshold voltage of the transistor shifts (for example, when positive charge is trapped on the back channel side, the threshold voltage of the transistor shifts in a negative direction). As one of factors of such charge trapping, a model of transfer and trap of cations (or atoms which are sources of the cations) can be considered. In the transistor including an oxide semiconductor, such cation sources may be hydrogen atoms. In the disclosed invention, the highly purified oxide semiconductor is used and is in contact with the stack of the metal oxide film and the insulating film; therefore, charge trapping caused by hydrogen assumed in the above model can be suppressed. The above model is supposed to be realized when the ionization rate of hydrogen is, for example, about 10%.

As described above, a semiconductor device including an oxide semiconductor, which has stable electric characteristics, can be provided. Therefore, a semiconductor device with high reliability can be provided.

The structures, methods, and the like described in this embodiment can be combined as appropriate with any of the structures, methods, and the like described in the other embodiments.

Embodiment 2

A semiconductor device having a display function (also referred to as a display device) can be manufactured using the transistor an example of which is described in Embodiment 1. Some or all of driver circuits including the transistors can be formed over a substrate where a pixel portion is formed, whereby a system-on-panel can be obtained.

Figure 6A:
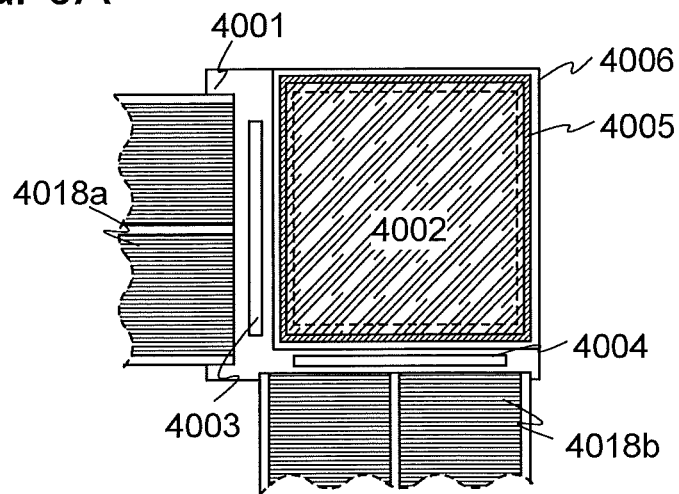
FIGS. 6A to 6C each illustrate one embodiment of a semiconductor device.

In FIG. 6A, a sealant 4005 is provided to surround a pixel portion 4002 provided over a first substrate 4001, and the pixel portion 4002 is sealed with the first substrate 4001, the sealant 4005 and the second substrate 4006. In FIG. 6A, a scan line driver circuit 4004 and a signal line driver circuit 4003 each are formed using a single crystal semiconductor film or a polycrystalline semiconductor film over a substrate prepared separately, and mounted in a region different from the region surrounded by the sealant 4005 over the first substrate 4001. Further, a variety of signals and potentials are supplied to the signal line driver circuit 4003 and the scan line driver circuit 4004 which are separately formed, and the pixel portion 4002 from flexible printed circuits (FPCs) 4018a and 4018b.

Figure 6B:
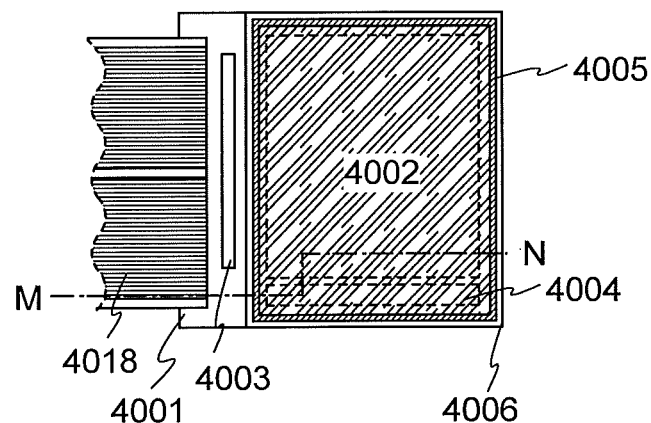
Figure 6C:
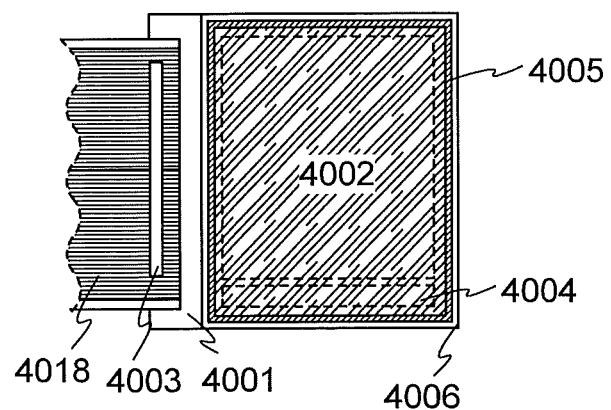

In FIGS. 6B and 6C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element, by the first substrate 4001, the sealant 4005, and the second substrate 4006. In FIGS. 6B and 6C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 6B and 6C, a variety of signals and potentials are supplied to the signal line driver circuit 4003 which is separately formed, the scan line driver circuit 4004, and the pixel portion 4002 from an FPC 4018.

Although FIGS. 6B and 6C each illustrate an example in which the signal line driver circuit 4003 is formed separately and mounted on the first substrate 4001, the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method or the like can be used. FIG. 6A shows an example in which the signal line driver circuit 4003 and the scan line driver circuit 4004 are mounted by a COG method. FIG. 6B shows an example in which the signal line driver circuit 4003 is mounted by a COG method. FIG. 6C shows an example in which the signal line driver circuit 4003 is mounted by a TAB method.

In addition, the display device includes a panel in which the display element is sealed, and a module in which an IC and the like including a controller are mounted on the panel.

Note that a display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

Further, the pixel portion and the scan line driver circuit which are provided over the first substrate include a plurality of transistors and the transistor which is described in Embodiment 1 can be used therefor.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Figure 7:
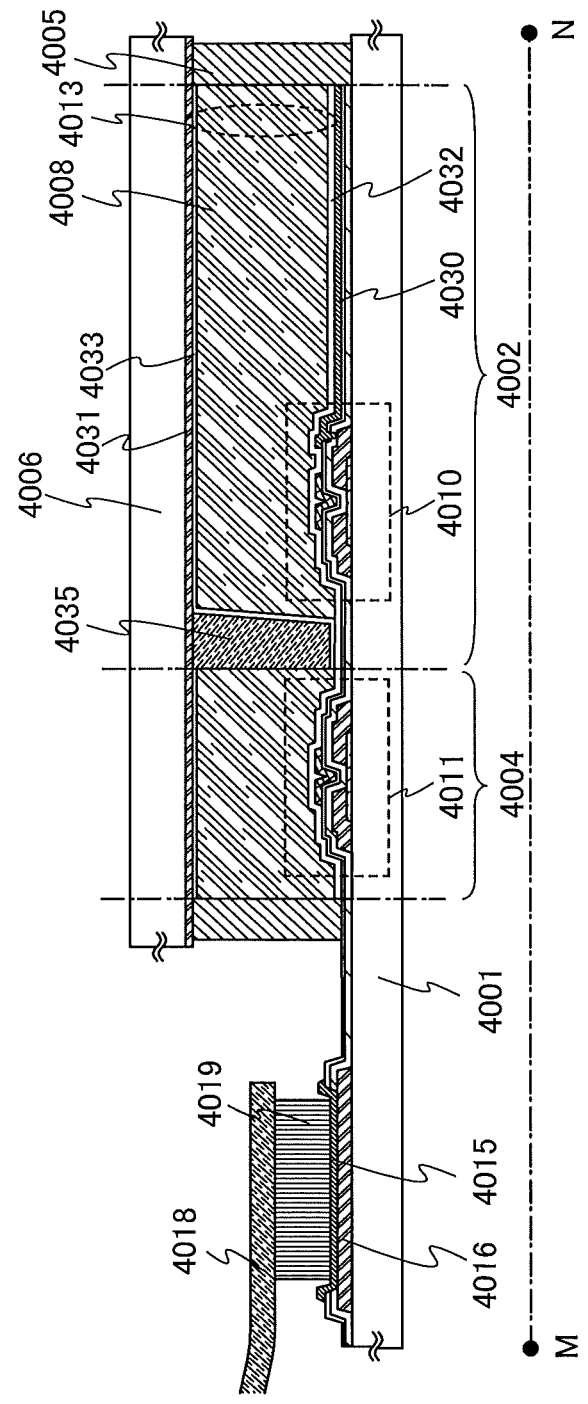
FIG. 7 illustrates one embodiment of a semiconductor device.
Figure 8:
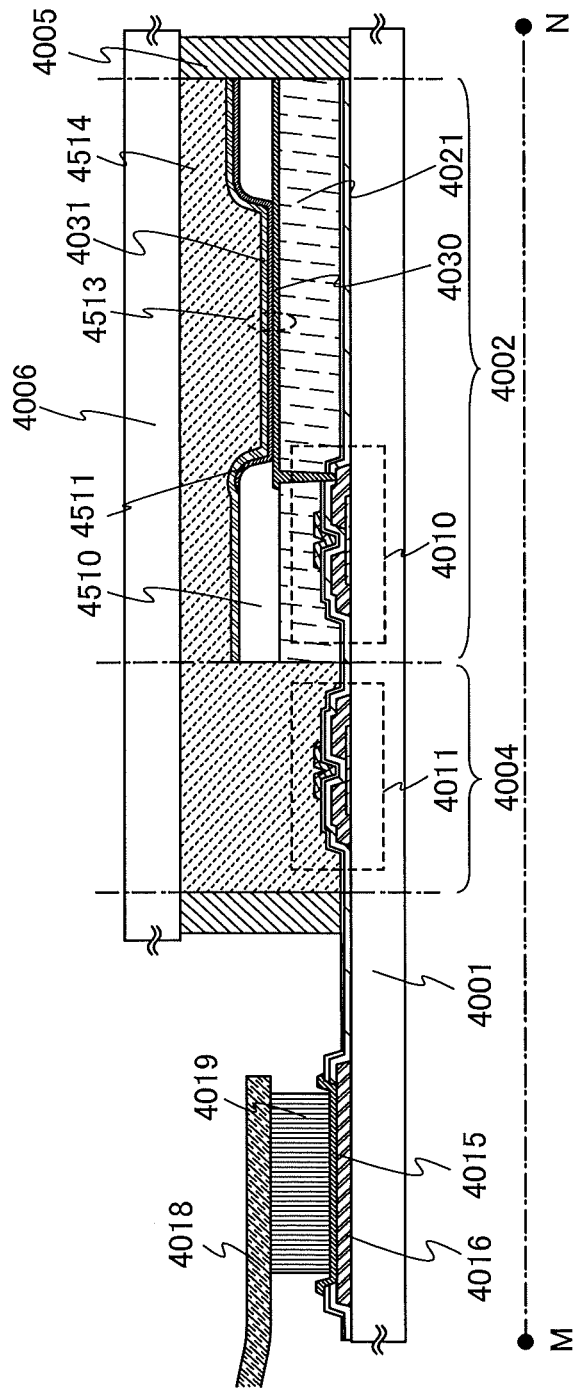
FIG. 8 illustrates one embodiment of a semiconductor device.
Figure 9:
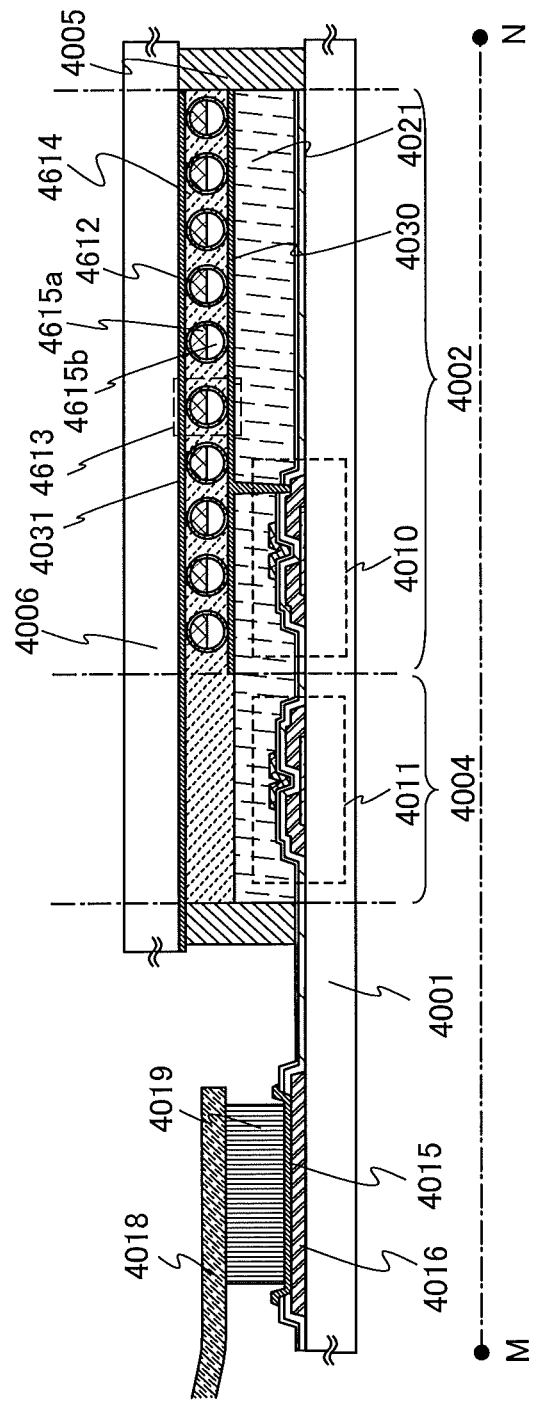
FIG. 9 illustrates one embodiment of a semiconductor device.

One embodiment of the semiconductor device is described with reference to FIG. 7, FIG. 8, and FIG. 9. FIG. 7 to FIG. 9 correspond to cross-sectional views taken along a line M-N in FIG. 6B.

As illustrated in FIG. 7 to FIG. 9, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as source and drain electrode layers of transistors 4010 and 4011.

Each of the pixel portion 4002 and the scan line driver circuit 4004 provided over the first substrate 4001 includes a plurality of transistors. In FIG. 7 to FIG. 9, the transistor 4010 included in the pixel portion 4002 and the transistor 4011 included in the scan line driver circuit 4004 are illustrated as an example.

In this embodiment, any of the transistors described in Embodiment 1 can be applied to the transistors 4010 and 4011. Consequently, variation in the electric characteristics of the transistors 4010 and 4011 is suppressed and the transistors 4010 and 4011 are electrically stable. Therefore, a semiconductor device with high reliability ca neb provided as the semiconductor devices of this embodiment illustrated in FIG. 7 to FIG. 9.

The transistor 4010 included in the pixel portion 4002 is electrically connected to a display element to form a display panel. A variety of display elements can be used as the display element as long as display can be performed.

An example of a liquid crystal display device using a liquid crystal element as a display element is illustrated in FIG. 7. In FIG. 7, a liquid crystal element 4013 which is a display element includes the first electrode layer 4030, a second electrode layer 4031, and a liquid crystal layer 4008. Insulating films 4032 and 4033 serving as alignment films are provided so that the liquid crystal layer 4008 is interposed therebetween. The second electrode layer 4031 is provided on the second substrate 4006 side, and the first electrode layer 4030 and the second electrode layer 4031 are stacked, with the liquid crystal layer 4008 interposed therebetween.

A columnar spacer denoted by reference numeral 4035 is obtained by selective etching of an insulating film and is provided in order to control the thickness (a cell gap) of the liquid crystal layer 4008. Although this embodiment shows an example of using a columnar shaper, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like can be used. These liquid crystal materials exhibit a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes a liquid crystal exhibiting a blue phase and a chiral agent has a short response time of 1 msec or less, has optical isotropy, which makes the alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal material is higher than or equal to $1 \times 10^9$ Ω·cm, preferably higher than or equal to $1 \times 10^{11}$ Ω·cm, more preferably higher than or equal to $1 \times 10^{12}$ Ω·cm. The value of the specific resistivity in this specification is measured at 20° C.

The size of a storage capacitor formed in the liquid crystal display device is set considering the leakage current of the transistor provided in the pixel portion or the like so that electrical charges can be held for a predetermined period. By using the transistor including the highly purity oxide semiconductor film, it is enough to provide a storage capacitor having capacitance that is ⅓ or less, preferably ⅕ or less of liquid crystal capacitance of each pixel.

In the transistor used in this embodiment, which includes a highly purified oxide semiconductor film, the current in an off state (the off-state current) can be made low. Accordingly, an electrical signal such as an image signal can be held for a longer period, and a writing interval can be set longer in an on state. Thus, frequency of refresh operation can be reduced, which leads to an effect of suppressing power consumption.

The field-effect mobility of the transistor including a highly purified oxide semiconductor film used in this embodiment can be relatively high, whereby high-speed operation is possible. Therefore, by using the transistor in a pixel portion of a liquid crystal display device, a high-quality image can be provided. In addition, since the transistors can be separately provided in a driver circuit portion and a pixel portion over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. The vertical alignment mode is a method of controlling alignment of liquid crystal molecules of a liquid crystal display panel, in which liquid crystal molecules are aligned vertically to a panel surface when no voltage is applied. Some examples are given as the vertical alignment mode. For example, a multi-domain vertical alignment (MVA) mode, a patterned vertical alignment (PVA) mode, an Advanced Super View (ASV) mode, and the like can be used. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

In addition, it is possible to employ a time-division display method (also called a field-sequential driving method) with use of a plurality of light-emitting diodes (LEDs) as a backlight. By employing a field-sequential driving method, color display can be performed without using a color filter.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. The present invention is not limited to the application to a display device for color display but can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes is transparent. A transistor and a light-emitting element are formed over a substrate. The light-emitting element can employ any of the following emission structures: a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side.

FIG. 8 illustrates an example of a light-emitting device in which a light-emitting element is used as a display element. A light-emitting element 4513 which is a display element is electrically connected to the transistor 4010 provided in the pixel portion 4002. A structure of the light-emitting element 4513 is not limited to the stacked-layer structure including the first electrode layer 4030, an electroluminescent layer 4511, and the second electrode layer 4031, which is illustrated here. The structure of the light-emitting element 4513 can be changed as appropriate depending on a direction in which light is extracted from the light-emitting element 4513, or the like.

A partition wall 4510 can be formed using an organic insulating material or an inorganic insulating material. It is particularly preferable that the partition wall 4510 be formed using a photosensitive resin material to have an opening over the first electrode layer 4030 so that a sidewall of the opening is formed as a tilted surface with continuous curvature.

The electroluminescent layer 4511 may be formed using a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC (diamond like carbon) film, or the like can be formed. In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material which allows high air-tightness and little degasification so that the panel is not exposed to the outside air, in this manner.

As the filler 4514, an ultraviolet curable resin or a thermosetting resin can be used as well as an inert gas such as nitrogen or argon. For example, poly(vinyl chloride) (PVC), acrylic, polyimide, an epoxy resin, a silicone resin, poly(vinyl butyral) (PVB), or ethylene with vinyl acetate (EVA) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, an electronic paper in which electronic ink is driven can be provided as the display device. The electronic paper is also referred to as an electrophoretic display device (an electrophoretic display) and is advantageous in that it has the same level of readability as plain paper, lower power consumption than other display devices, and a thin and lightweight form.

An electrophoretic display device can have a variety of modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

FIG. 9 illustrates an active matrix electronic paper as one embodiment of a semiconductor device. The electronic paper in FIG. 9 is an example of a display device using a twisting ball display system. The twist ball display method refers to a method in which spherical particles each colored in black and white are arranged between electrode layers included in a display element, and a potential difference is generated between the electrode layers to control the orientation of the spherical particles, so that display is performed.

Between the first electrode layer 4030 connected to the transistor 4010 and the second electrode layer 4031 provided on the second substrate 4006, spherical particles 4613 each of which includes a black region 4615a, a white region 4615b, and a cavity 4612 which is filled with liquid around the black region 4615a and the white region 4615b, are provided. A space around the spherical particles 4613 is filled with a filler 4614 such as a resin. The second electrode layer 4031 corresponds to a common electrode (counter electrode). The second electrode layer 4031 is electrically connected to a common potential line.

Note that in FIG. 7 to FIG. 9, a flexible substrate as well as a glass substrate can be used as the first substrate 4001 and the second substrate 4006, e.g., a plastic substrate having a light-transmitting property or the like. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

An insulating layer 4021 can be formed using an inorganic insulating material or an organic insulating material. Note that the insulating layer 4021 formed using a heat-resistant organic insulating material such as an acrylic resin, polyimide, a benzocyclobutene resin, polyamide, or an epoxy resin is preferably used as a planarizing insulating film. Other than such organic insulating materials, it is possible to use a low dielectric constant material (a low-k material), a siloxane-based resin, phosphosilicate glass (PSG), borophosphosilicate glass (BPSG), or the like. The insulating layer may be formed by stacking a plurality of insulating films formed of these materials.

There is no particular limitation on the method for forming the insulating layer 4021, and the insulating layer 4021 can be formed, depending on the material, by sputtering, spin coating, dipping, spray coating, droplet discharging (e.g., ink-jet, screen printing, or offset printing), roll coating, curtain coating, knife coating, or the like.

The display device displays an image by transmitting light from a light source or a display element. Therefore, the substrate and the thin films such as the insulating film and the conductive film provided for the pixel portion where light is transmitted have light-transmitting properties with respect to light in the visible-light wavelength range.

The first electrode layer 4030 and the second electrode layer 4031 (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Alternatively, the first electrode layer 4030 and the second electrode layer 4031 can be formed using one or more of materials selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of these metals; and a nitride of these metals.

A conductive composition containing a conductive high molecule (also referred to as a conductive polymer) can be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken owing to static electricity or the like, a protection circuit for protecting the driver circuit is preferably provided. The protection circuit is preferably formed using a nonlinear element.

As described above, by using any of the transistors described in Embodiment 1, a semiconductor device having higher reliability can be provided. Note that the transistors described in Embodiment 1 can be applied to semiconductor devices having a variety of functions such as a power device mounted in a power circuit, a semiconductor integrated circuit such as an LSI circuit, and a semiconductor device having an image sensor function with which information of an object is read, in addition to the semiconductor device having the above display function.

The structures, methods, and the like described in this embodiment can be combined as appropriate with any of the structures, methods, and the like described in the other embodiments.

Embodiment 3

A semiconductor device disclosed in this specification can be applied to a variety of electronic devices (including game machines). Examples of electronic devices include a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the semiconductor device described in the above embodiment are described.

Figure 10A:
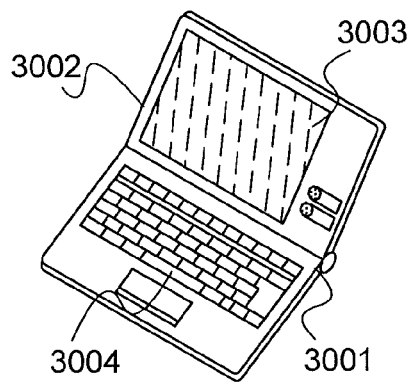
FIGS. 10A to 10F each illustrate an electronic device.

FIG. 10A illustrates a laptop personal computer, which includes a main body 3001, a housing 3002, a display portion 3003, a keyboard 3004, and the like. The semiconductor device described in Embodiment 1 or 2 is applied, whereby a highly reliable laptop personal computer can be provided.

Figure 10B:
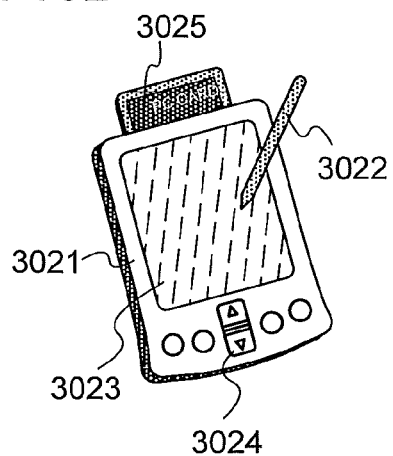

FIG. 10B is a portable information terminal (PDA) which includes a display portion 3023, an external interface 3025, an operation button 3024, and the like in a main body 3021. A stylus 3022 is included as an accessory for operation. The semiconductor device described in Embodiment 1 or 2 is applied, whereby the highly reliable personal digital assistant (PDA) can be provided.

Figure 10C:
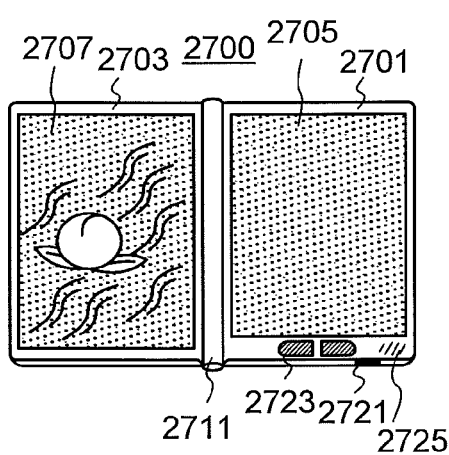

FIG. 10C illustrates an example of an electronic book reader. For example, the electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 10C) and graphics can be displayed on a display portion on the left side (the display portion 2707 in FIG. 10C). The semiconductor device described in Embodiment 1 or 2 is applied, whereby a highly reliable electronic book reader can be provided.

FIG. 10C illustrates an example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the electronic book reader 2700 may have a function of an electronic dictionary.

The electronic book reader 2700 may have a configuration capable of wirelessly transmitting and receiving data. Through wireless communication, desired book data or the like can be purchased and downloaded from an electronic book server.

Figure 10D:
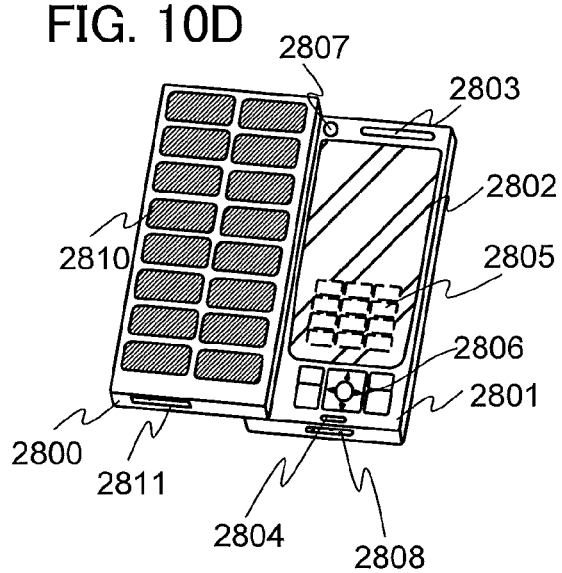

FIG. 10D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the portable information terminal, an external memory slot 2811, and the like. Further, an antenna is incorporated in the housing 2801. The semiconductor device described in Embodiment 1 or 2 is applied, whereby a highly reliable mobile phone can be provided.

Further, the display panel 2802 is provided with a touch panel. A plurality of operation keys 2805 which are displayed as images is illustrated by dashed lines in FIG. 10D. Note that a boosting circuit by which a voltage output from the solar cell 2810 is increased to be sufficiently high for each circuit is also included.

In the display panel 2802, the display direction can be appropriately changed depending on a usage pattern. Further, the camera lens 2807 is provided on the same surface as the display panel 2802, and thus it can be used as a video phone. The speaker 2803 and the microphone 2804 can be used for videophone calls, recording and playing sound, and the like as well as voice calls. Moreover, the housings 2800 and 2801 in a state where they are opened as illustrated in FIG. 10D can be slid so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided.

Figure 10E:
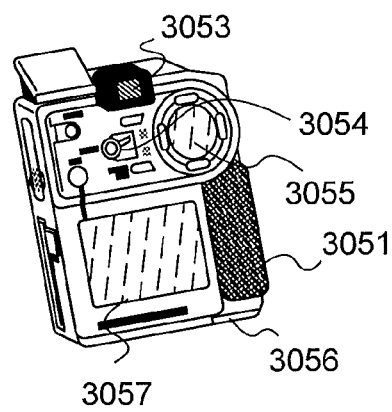

FIG. 10E illustrates a digital video camera which includes a main body 3051, a display portion A 3057, an eyepiece 3053, an operation switch 3054, a display portion B 3055, a battery 3056, and the like. The semiconductor device described in Embodiment 1 or 2 is applied, whereby a highly reliable digital video camera can be provided.

Figure 10F:
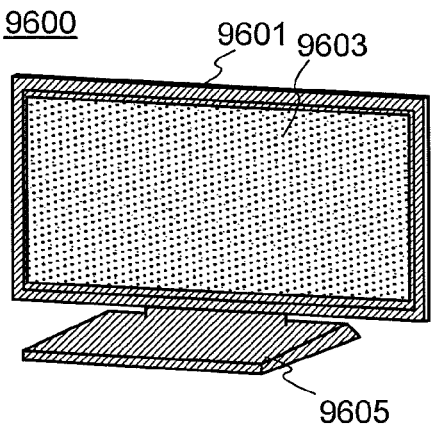

FIG. 10F illustrates an example of a television set. In the television set 9600, a display portion 9603 is incorporated in a housing 9601. The display portion 9603 can display images. Here, the housing 9601 is supported by a stand 9605. The semiconductor device described in Embodiment 1 or 2 is applied, whereby a highly reliable television set can be provided.

The television set 9600 can be operated with an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

The structures, methods, and the like described in this embodiment can be combined as appropriate with any of the structures, methods, and the like described in the other embodiments.

This application is based on Japanese Patent Application serial no. 2010-086461 filed with Japan Patent Office on Apr. 2, 2010, the entire contents of which are hereby incorporated by reference.

What is claimed is:

1. A semiconductor device comprising:
an oxide semiconductor film comprising a channel formation region;
a source electrode and a drain electrode over and electrically connected to the oxide semiconductor film;
a gallium oxide film over the oxide semiconductor film, the source electrode and the drain electrode;
a gate insulating film over and in contact with the gallium oxide film; and
a gate electrode over the gate insulating film,
wherein the gate electrode and the channel formation region overlap each other with the gate insulating film therebetween, and
wherein the gallium oxide film is in contact with an outer side surface of each of the source electrode and the drain electrode.

2. The semiconductor device according to claim 1, wherein an energy gap of the gallium oxide film is larger than an energy gap of the oxide semiconductor film.

3. The semiconductor device according to claim 1, wherein an energy at a bottom of a conduction band of the gallium oxide film is higher than an energy at a bottom of a conduction band of the oxide semiconductor film.

4. The semiconductor device according to claim 1, wherein the gate insulating film comprises silicon oxide or hafnium oxide.

5. The semiconductor device according to claim 1, wherein the gate insulating film comprises aluminum oxide or aluminum nitride.

6. The semiconductor device according to claim 1, wherein at least a part of a top surface of the oxide semiconductor film is in contact with the source electrode and the drain electrode.

7. The semiconductor device according to claim 1, further comprising an insulating film that covers the gate insulating film and the gate electrode.

8. The semiconductor device according to claim 1, wherein the gallium oxide film is in contact with a top surface of the oxide semiconductor film between the source electrode and the drain electrode.

9. The semiconductor device according to claim 1, wherein the gallium oxide film is in contact with side surfaces of the oxide semiconductor film in a channel width direction.

10. A semiconductor device comprising:
an oxide semiconductor film comprising a channel formation region;
a source electrode and a drain electrode over and electrically connected to the oxide semiconductor film;
a metal oxide film over the oxide semiconductor film, the source electrode and the drain electrode;
a gate insulating film on and in contact with the metal oxide film; and
a gate electrode over the gate insulating film,
wherein the gate electrode and the channel formation region overlap each other with the gate insulating film therebetween,
wherein the metal oxide film is in contact with an outer side surface of each of the source electrode and the drain electrode, and
wherein the metal oxide film comprises one or more metal elements included in the oxide semiconductor film.

11. The semiconductor device according to claim 10, wherein an energy gap of the metal oxide film is larger than an energy gap of the oxide semiconductor film.

12. The semiconductor device according to claim 10, wherein an energy at a bottom of a conduction band of the metal oxide film is higher than an energy at a bottom of a conduction band of the oxide semiconductor film.

13. The semiconductor device according to claim 10, wherein the metal oxide film comprises gallium.

14. The semiconductor device according to claim 10, wherein the gate insulating film comprises silicon oxide or hafnium oxide.

15. The semiconductor device according to claim 10, wherein the gate insulating film comprises aluminum oxide or aluminum nitride.

16. The semiconductor device according to claim 10, wherein at least a part of a top surface of the oxide semiconductor film is in contact with the source electrode and the drain electrode.

17. The semiconductor device according to claim 10, further comprising an insulating film that covers the gate insulating film and the gate electrode.

18. The semiconductor device according to claim 10, wherein the metal oxide film is in contact with a top surface of the oxide semiconductor film between the source electrode and the drain electrode.

19. The semiconductor device according to claim 10, wherein the metal oxide film is in contact with side surfaces of the oxide semiconductor film in a channel width direction.

* * * * *